United States Patent
Chen (10) Patent No.: US 6,231,139 B1
(45) Date of Patent: May 15, 2001

(54) COMPUTER ENCLOSURE INCORPORATING A FIXING COVER

(75) Inventor: Chia Hua Chen, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/451,682

(22) Filed: Nov. 30, 1999

(30) Foreign Application Priority Data

Sep. 23, 1999 (TW) .............................................. 088216271

(51) Int. Cl.⁷ ...................................................... H05K 7/18

(52) U.S. Cl. ........................ 312/223.2; 361/788; 361/801

(58) Field of Search ............................... 312/223.2, 265.5, 312/265.6; 361/798, 788, 801, 796, 686, 683, 787, 726, 786, 754

(56) References Cited

U.S. PATENT DOCUMENTS

| | | | |
|---|---|---|---|
| 5,640,309 | * 6/1997 | Carney et al. | 361/686 |
| 5,673,175 | * 9/1997 | Carney et al. | 361/686 |
| 5,694,291 | * 12/1997 | Feightner | 361/801 X |
| 5,822,196 | * 10/1998 | Hastings et al. | 361/801 |
| 5,936,835 | * 8/1999 | Astier | 361/683 |

* cited by examiner

Primary Examiner—Janet M. Wilkens
(74) Attorney, Agent, or Firm—Wei Te Chung (57) ABSTRACT

A computer enclosure is used to mount a slot cover having a bent portion. The computer enclosure includes a rear panel, a fastener movably attached to the rear panel, and a fixing cover pivotably mounted to the rear panel and engaging with the fastener. The rear panel has a fixing plate for abutment of the bent portion of the slot cover. The fixing cover has a number of spring fingers for pressing the fixing plate of the rear panel. The bent portion of the slot cover is secured between the spring finger and the fixing plate thereby fixing the slot cover.

19 Claims, 7 Drawing Sheets

COMPUTER ENCLOSURE INCORPORATING A FIXING COVER

BACKGROUND OF THE INVENTION

1. Field of the Invention

The present invention relates to a computer enclosure, and particularly to a computer enclosure incorporating a pivotable fixing cover for fixing a slot cover to be attached thereto.

2. The Related Art

As computer's functions increase, computers are being equipped with more and more devices and expansion cards. Motherboards today normally mount a plurality of expansion connectors thereon for receiving expansion cards, thereby expanding the computer's functions. Correspondingly, computer enclosures are required to define a plurality of slots for providing accesses to the expansion cards. Examples of such computer enclosures are disclosed in U.S. Pat. Nos. 4,744,006, 4,979,075 and 5,121,295. An expansion card is fixed in a conventional enclosure using a bolt. Thus, the assembly operation for adding new expansion cards is complicated and time-consuming.

Figure 1:
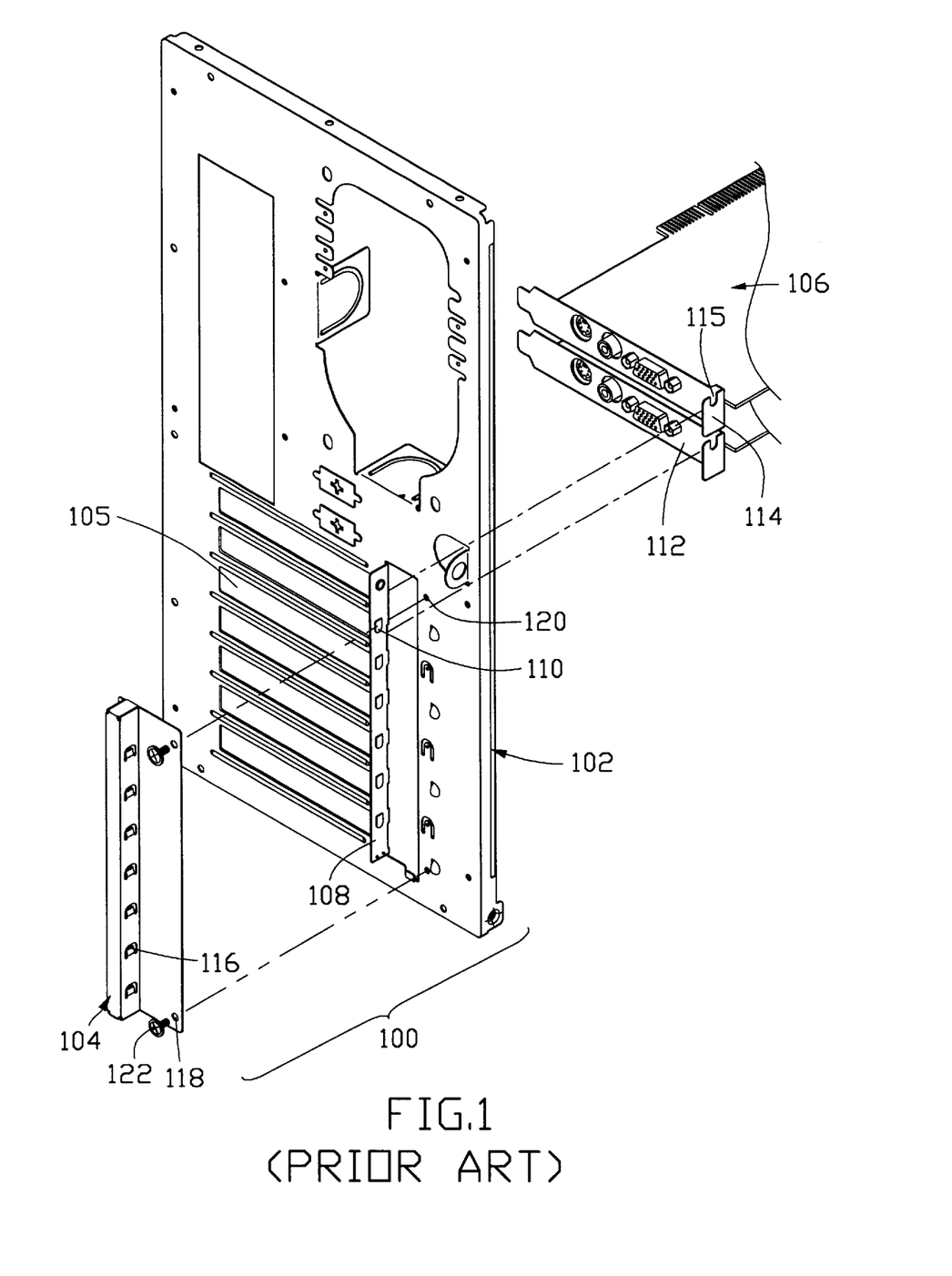
FIG. 1 is an exploded view of a rear panel of a conventional computer enclosure and expansion cards to be attached thereto.

Referring to FIG. 1 of the attached figures, a computer enclosure 100 is disclosed in Taiwan Patent Application No. 88201721 which was filed on Feb. 2, 1999 by the present applicant and includes a rear panel 102 and a fixing cover 104 attached to the rear panel 102. The rear panel 102 defines a plurality of expansion slots 105 for providing accesses to expansion cards 106. A fixing plate 108 is stamped from the rear panel 102 adjacent to an end of the expansion slots 105 and forms a plurality of protrusions 110. Each expansion card 106 includes a slot cover 112 forming a bent portion 114 for abutting against the fixing plate 108. Each bent portion 114 defines a cutout 115 for engaging with the protrusion 110 of the fixing plate 108 thereby positioning the expansion card 106. The fixing cover 104 forms a plurality of spring tabs 116 for pressing the bent portion 114 of the slot cover 112 thereby fixing the expansion card 106. A pair of through holes 118 is defined in the fixing cover 104 and a pair of screw holes 120 is correspondingly defined in the rear panel 102. A pair of bolts 122 extends through the through holes 118 and threadedly engages with the screw holes 120 thereby fixing the fixing cover 104 to the rear panel 102. However, attaching the fixing cover 104 to the rear panel 102 by bolts 122 is complicated.

SUMMARY OF THE INVENTION

Accordingly, an object of the present invention is to provide a computer enclosure having a pivotable fixing cover for facilitating assembly or disassembly of an expansion card.

Another object of the present invention is to provide a computer enclosure having a movable fastener for facilitating fixing or detaching a fixing cover thereof To fulfil the objects mentioned above, a computer enclosure in accordance with the present invention is adapted to mount a slot cover having a bent portion. The computer enclosure comprises a rear panel, a fastener movably attached to the rear panel, and a fixing cover pivotably mounted to the rear panel and engaging with the fastener. The rear panel has a fixing plate for abutment of the bent portion of the slot cover. The fixing cover has a plurality of spring fingers for pressing the fixing plate of the rear panel. The bent portion of the slot cover is secured between a spring finger and the fixing plate thereby fixing the slot cover.

Other objects and advantages of the present invention will be understood from the following description of a preferred embodiment according to attached drawings of the present invention.

DETAILED DESCRIPTION OF THE PREFERRED EMBODIMENT

Figure 2:
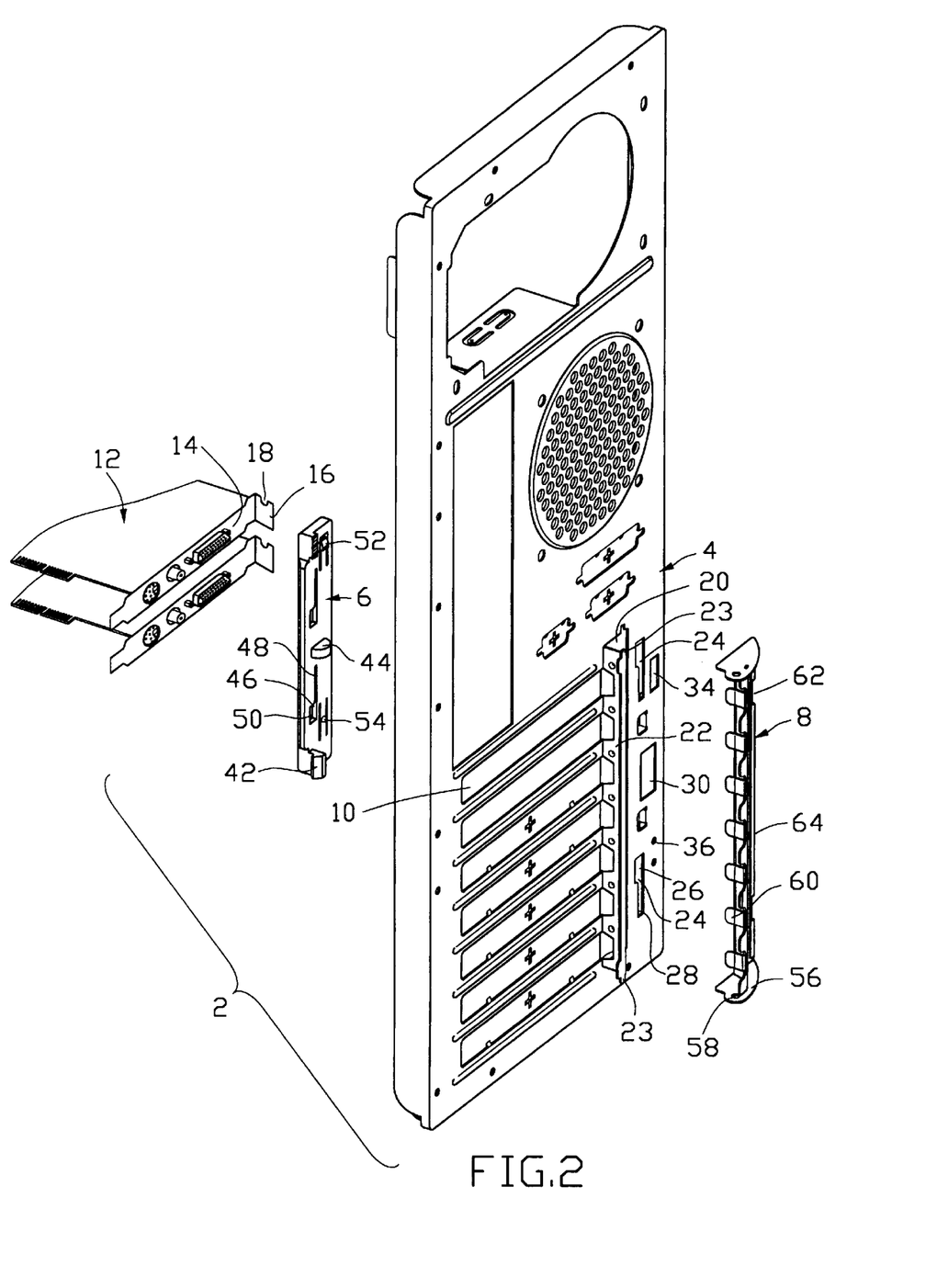
FIG. 2 is an exploded view of a rear panel of a computer enclosure of the present invention and expansion cards to be attached thereto.
Figure 3:
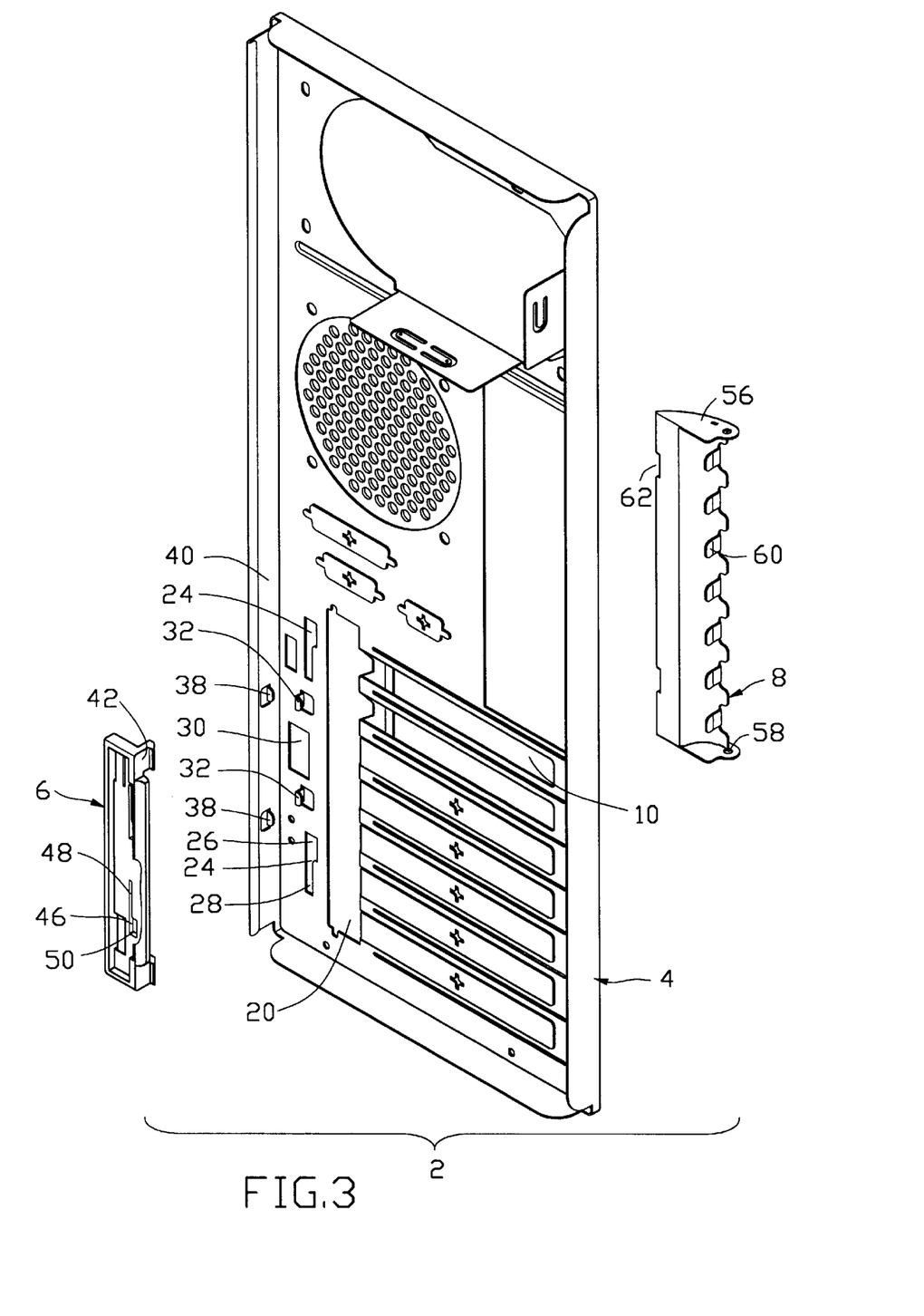
FIG. 3 is an exploded view of the rear panel of FIG. 2 from an inward side.

Referring to FIGS. 2 and 3, a computer enclosure 2 in accordance with the present invention includes a rear panel 4, a fastener 6 movably attached to the rear panel 4, and a fixing cover 8 pivotably attached to the rear panel 4 and fixed by the fastener 6. The panel 4 defines a plurality of parallel expansion card slots 10 for providing access to and receiving expansion cards 12. Each expansion card 12 includes a slot cover 14 from which a bent portion 16 perpendicularly extends. A cutout 18 is defined in the bent portion 16. An elongated slot 20 is longitudinally defined in the rear panel 4 in communication with a distal end of each expansion slot 10 for extension of the bent portion 16. A fixing plate 22 perpendicularly extends from a first lateral edge of the elongated slot 20 proximate to the card slots 10 for abutment of the bent portion 16 of the slot cover 14. A plurality of protrusions 74 (see FIG. 5) is formed on a surface of the fixing plate 22 for being retainingly received in the associated cutouts 18 of the slot cover 14 thereby positioning the expansion cards 12. A pair of pivoting protrusions 23 is formed at opposite side edges of the fixing plate 22.

A pair of first through slots 24 is defined along a second lateral edge of the elongated slot 20. Each first through slot 24 includes a first wide portion 26 and a first narrow portion 28. A rectangular hole 30 is defined between the first through slots 24. A pair of bent tabs 32 is respectively formed between the first through slots 24 and the rectangular hole 30. A positioning hole 34 is defined above the rectangular hole 30 and a pair of apertures 36 is defined under the rectangular hole 30. A pair of retaining tabs 38 extends from a flange 40 of the rear panel 4 proximate to the rectangular hole 30.

The fastener 6 includes a pair of latches 42 extending from opposite ends thereof for extending through and moving along the first through slots 24. An actuating protrusion 44 is formed between the latches 42 for being movably received in the rectangular hole 30. A pair of second through slots 46 is defined between the latches 42 and the actuating protrusion 44 and includes a second narrow portion 48 and a second wide portion 50. A positioning protrusion 52 is formed above the actuating protrusion 44 for being movably received in the positioning hole 34 of the rear panel 4, and a projecting point 54 is formed under the actuating protrusion 44 for alternative insertion into the apertures 36 of the rear panel 4.

The fixing cover 8 includes a pair of side plates 56 each defining a pivoting hole 58 for pivotably receiving the pivoting protrusions 23 of the rear panel 4 whereby the fixing cover 8 is pivotable about the rear panel 4. A plurality of spring fingers 60 extends from the fixing cover between the side plates 56 for pressing the bent portions 16 of the slot covers 14 thereby fixing the expansion cards 12. A pair of recesses 62 is defined in a flange 64 of the fixing cover 8 opposite the spring fingers 60 for receiving the latches 42 of the fastener 6.

Figure 4:
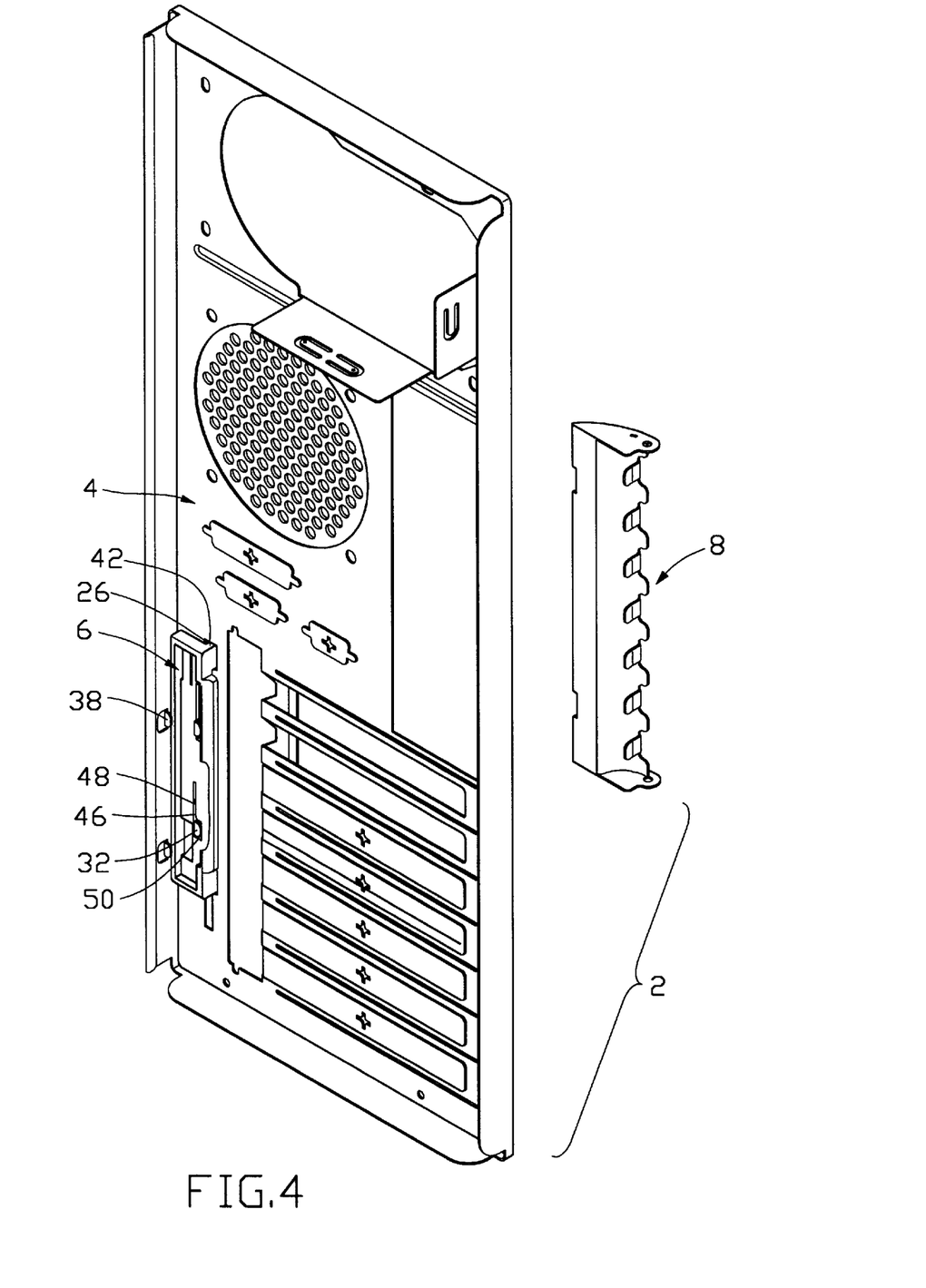
FIG. 4 is a partially assembled view of the rear panel of FIG. 3.
Figure 5:
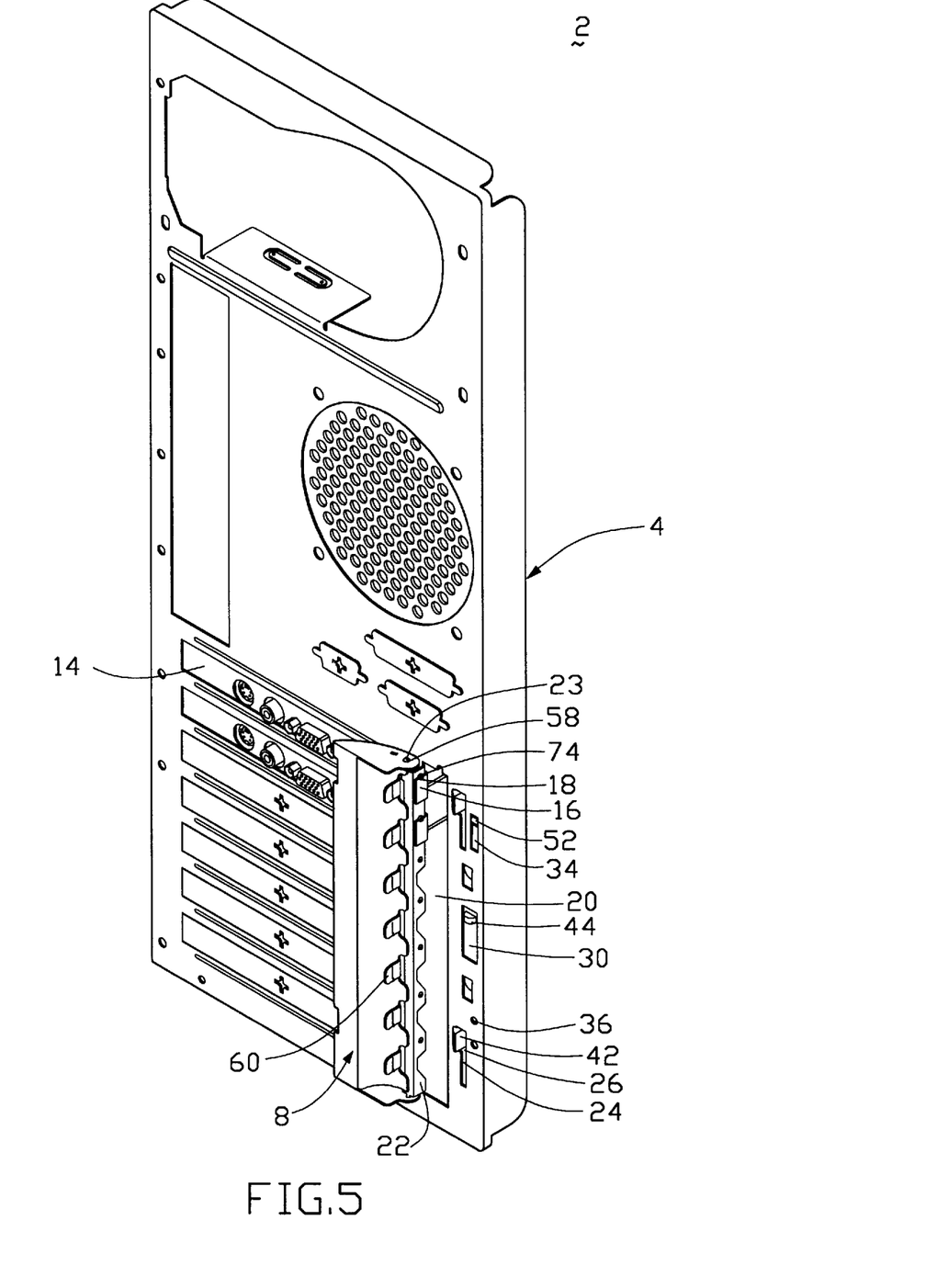
FIG. 5 is an assembled view of the rear panel of a computer enclosure of the present invention and the expansion cards attached thereto showing the expansion cards being positioned at the rear panel.

Referring to FIGS. 4 and 5, in assembly, each slot cover 14 is exposed in the associated expansion slot 10 of the rear panel 4. The bent portion 16 of the slot cover 14 extends through the elongated slot 20 and abuts against the fixing plate 22 with the cutout 18 thereof snugly receiving the protrusion 74. The latches 42 of the fastener 6 extend through the first wide portions 26 of the first through slots 24, while the bent tabs 32 of the rear panel 4 extend through the second wide portions 50 of the second through slots 46 of the fastener 6. Simultaneously, the retaining tabs 38 abut against the fastener 6. The actuating protrusion 44 and the positioning protrusion 52 of the fastener 6 are respectively received at the top of the rectangular hole 30 and the positioning hole 34 of the rear panel 4. The projecting point 54 of the fastener 6 (see FIG. 2) skips into the top aperture 36 of the rear panel 4. The fixing cover 8 is pivoted about the fixing plate 22 of the rear panel 4 with the pivoting holes 58 receiving the pivoting protrusions 23 of the fixing plate 22.

Figure 6:
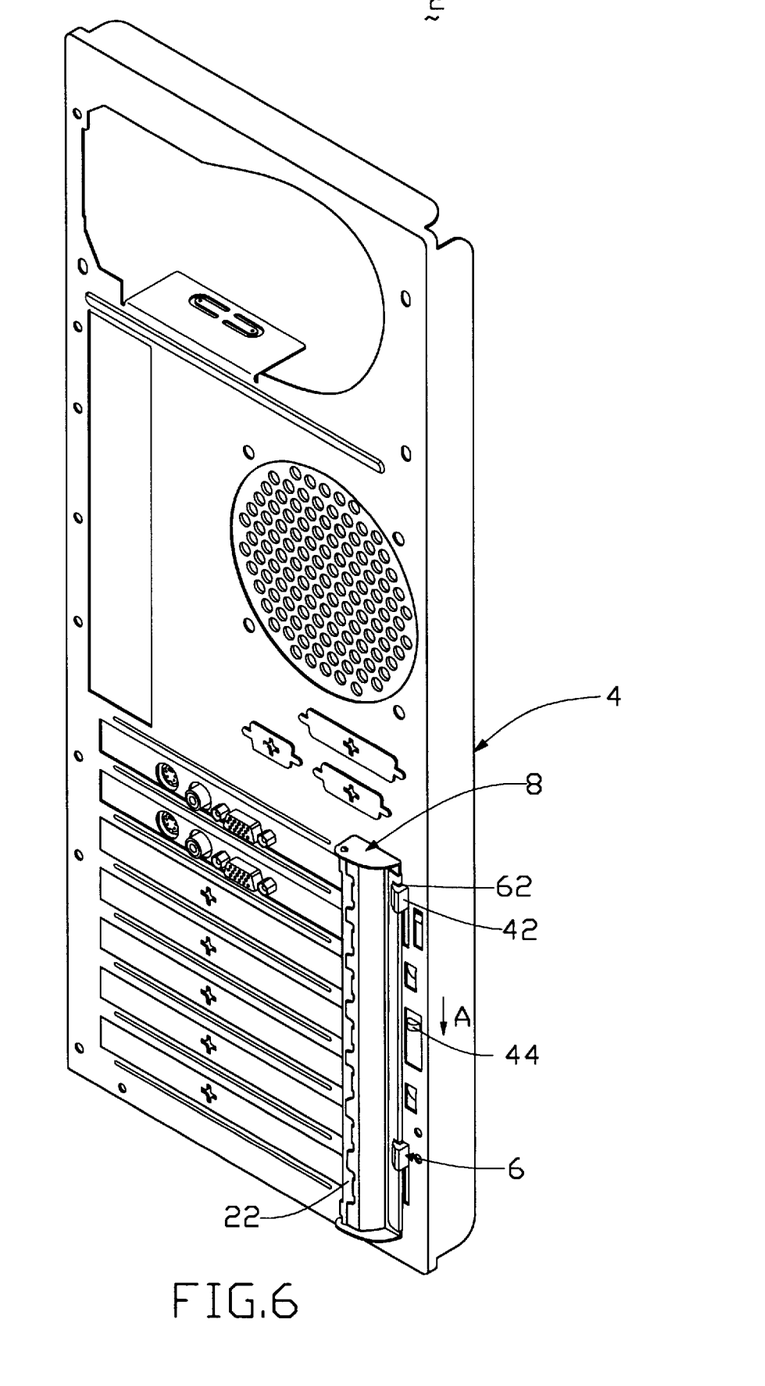
FIG. 6 is an assembled view of the rear panel of a computer enclosure of the present invention and the expansion cards attached thereto showing the expansion cards being fixed at the rear panel.
Figure 7:
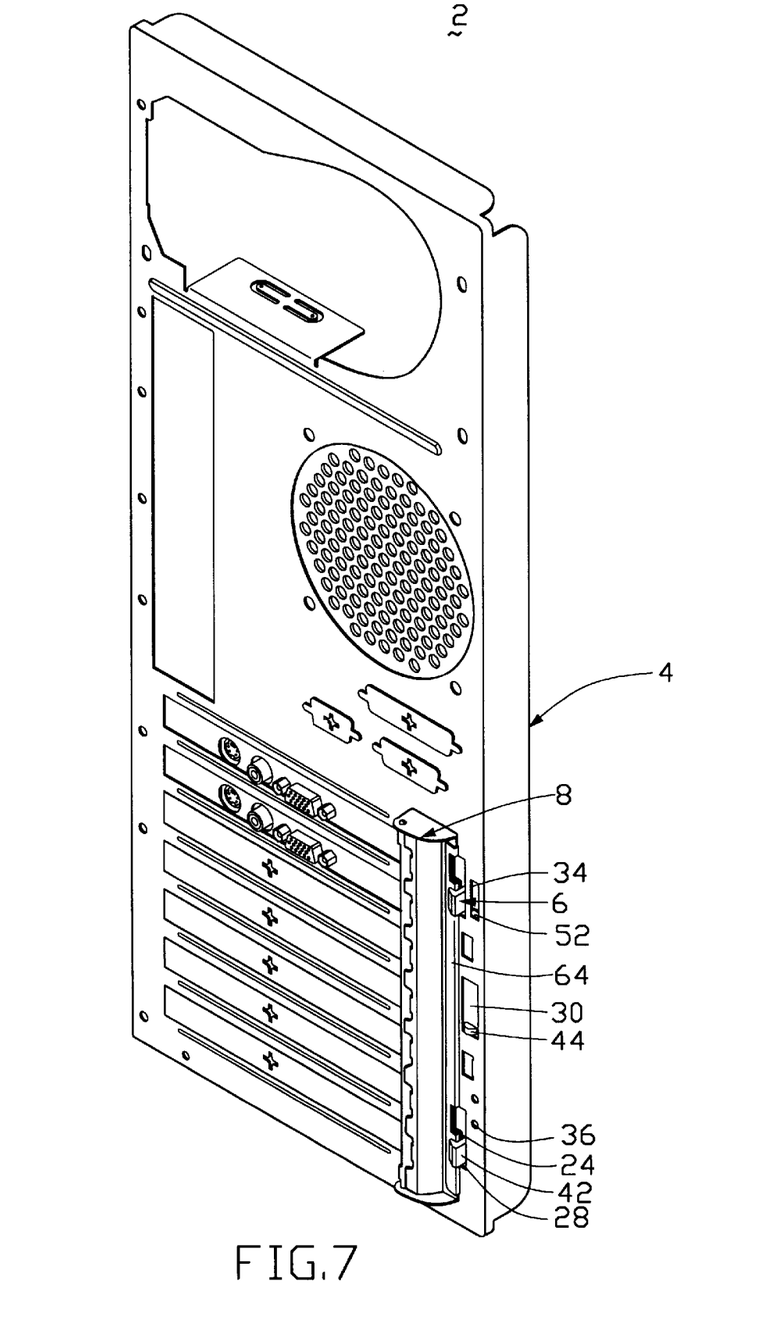
FIG. 7 is an assembled view of the rear panel of a computer enclosure of the present invention and the expansion cards attached thereto showing the fixing cover being fixed at the rear panel by the fastener.

Referring to FIGS. 5–7, the fixing cover 8 is pivoted about the fixing plate 22 to abut against the rear panel 4 with the recesses 62 thereof receiving the latches 42 of the fastener 6. The spring fingers 60 of the fixing cover 8 press the bent portions 16 of the corresponding slot covers 14 thereby fixing the slot cover 14. The user pushes the fastener 6 to slide in direction A by pressing downward on the actuating protrusion 44 until the positioning protrusion 52 thereof engages with the bottom edge of the positioning hole 34 of the rear panel 4. The latches 42 of the fastener 6 slide to the first narrow portions 28 of the first through slots 24 and engage with the flange 64 of the fixing cover 8 thereby fixing the fixing cover 8 to the rear panel 4. The bent tabs 32 of the rear panel 4 slide to the second narrow portions 48 of the second through slots 46 and engage with the fastener 6 (see FIG. 4). The projecting point 54 of the fastener 6 skips into the bottom aperture 36 of the rear panel 4. Thus, the assembly is easily achieved.

To disassemble, the user presses upward on the actuating portion 44 causing the latches 42 of the fastener 6 to move into the recesses 62 of the fixing cover 8. The fixing cover 8 is then pivoted about the fixing plate 22 until the spring fingers 60 detach from the bent portion 16 of the slot cover 14 thereby freeing the slot cover 14 for easy disassembly.

It will be understood that the present invention may be embodied in other forms without departing from the spirit thereof. The present example and embodiment, therefore, is to be considered in all respects as illustrative and not restrictive, and the invention is not to be limited to the details given herein.

What is claimed is:

1. A computer enclosure comprising: a rear panel having a fixing plate abutting against a bent portion of a slot cover;

a fastener movably attached to the rear panel; and a fixing cover pivotably mounted to the rear panel and engaging with the fastener, the fixing cover having a plurality of spring fingers for pressing the bent portion against the fixing plate of the rear panel, thereby fixing the slot cover to the fixing plate.

2. The computer enclosure as described in claim 1, wherein a first through slot is defined in the rear panel, and wherein the fastener has a latch for extending through and moving along the first through slot.

3. The computer enclosure as claimed in claim 2, wherein the first through slot includes a first wide portion for extension of the latch therethrough and a first narrow portion for movement of the latch therein.

4. The computer enclosure as described in claim 2, wherein a recess is defined in a flange of the fixing cover for receiving the latch of the fastener.

5. The computer enclosure as described in claim 2, wherein a bent tab is formed at the rear panel, and wherein a second through slot is defined in the fastener for extension of the bent tab therethrough.

6. The computer enclosure as described in claim 5, wherein the second through slot includes a second wide portion for extension of the bent tab therethrough and a second narrow portion for movement of the bent tab therein.

7. The computer enclosure as described in claim 1, wherein a rectangular hole is defined in the rear panel, and wherein an actuating protrusion is formed on the fastener for being movably received in the rectangular hole.

8. The computer enclosure as described in claim 1, wherein a positioning hole is defined in the rear panel, and wherein a positioning protrusion is formed on the fastener for being movably received in the positioning hole.

9. The computer enclosure as claimed in claim 1, wherein a retaining tab extends from a flange of the rear panel for engaging with the fastener.

10. The computer enclosure as described in claim 1, wherein a pair of pivoting protrusions is formed at opposite side edges of the fixing plate of the rear panel, and wherein the fixing cover comprises a pair of side plates each defining a pivoting hole for pivotably receiving the pivoting protrusions.

11. A computer enclosure adapted to mount a plurality of slot covers, comprising:

a rear panel defining a first through slot;

a fastener movably attached to the rear panel, the fastener having a latch for extending through and moving along the first through slot of the rear panel; and a fixing cover mounted to the rear panel for fixing the slot covers, a recess defined in a flange of the fixing cover for receiving the latch of the fastener, the latch being movable along the first through slot of the rear panel to engage with the flange thereby securing the fixing cover between the rear panel and the fastener.

12. The computer enclosure as claimed in claim 11, wherein the first through slot includes a first wide portion for extension of the latch therethrough and a first narrow portion for movement of the latch therein.

13. The computer enclosure as described in claim 12, wherein a bent tab is formed on the rear panel, and wherein a second through slot is defined in the fastener for extension of the bent tab.

14. The computer enclosure as described in claim 13, wherein the second through slot includes a second wide portion for extension of the bent tab therethrough and a second narrow portion for movement of the bent tab therein.

15. The computer enclosure as described in claim 11, wherein a rectangular hole is defined in the rear panel, and wherein an actuating protrusion is formed on the fastener for being movably received in the rectangular hole.

16. The computer enclosure as described in claim 11, wherein a positioning hole is defined in the rear panel, and wherein a positioning protrusion is formed on the fastener for being movably received in the positioning hole.

17. The computer enclosure as claimed in claim 11, wherein a retaining tab extends from a flange of the rear panel for engaging with the fastener.

18. A computer enclosure comprising:

a rear panel defining therein a plurality of juxtaposed expansion card slots and an associated elongated slot proximate to one side end of said expansion card slots with a fixing plate extending along a longitudinal edge thereof;

a plurality of slot covers attachably received in said corresponding expansion card slots, each of said slot covers including a bent portion seated on the fixing plate; and a fixing cover pivotably mounted to the rear panel and generally covering said elongated slot, said fixing cover including means for retainably engaging the bent portions of the slot covers when said fixing cover is rotated to a locked closed position; wherein said fixing cover is secured to the rear panel by a fastener without rotation of said fastener.

19. The computer enclosure as described in claim 18, wherein said fastener is linearly moveably attached to the rear panel.

* * * * *